(12) United States Patent
Liu et al.

(10) Patent No.: US 11,961,846 B2
(45) Date of Patent: Apr. 16, 2024

(54) ARRAY SUBSTRATE AND MOTHER-BOARD FOR ARRAY SUBSTRATES

(71) Applicant: KunShan Go Visionox Opto Electronics Co., Ltd, Jiangsu (CN)

(72) Inventors: Quan Liu, Kunshan (CN); Xu Qin, Kunshan (CN); Weilong Li, Kunshan (CN); Lu Zhang, Kunshan (CN); Siming Hu, Kunshan (CN); Zhenzhen Han, Kunshan (CN)

(73) Assignee: KunShan Go Visionox Opto Electronics Co., Ltd, Kunshan (CN)

( * ) Notice: Subject to any disclaimer, the term of this patent is extended or adjusted under 35 U.S.C. 154(b) by 389 days.

(21) Appl. No.: 17/358,419

(22) Filed: Jun. 25, 2021

(65) Prior Publication Data

US 2021/0320133 A1    Oct. 14, 2021

Related U.S. Application Data

(63) Continuation of application No. PCT/CN2019/118327, filed on Nov. 14, 2019.

(30) Foreign Application Priority Data

May 28, 2019  (CN) .......................... 201910452389.6

(51) Int. Cl.
*H01L 27/12* (2006.01)
*G09G 3/3233* (2016.01)

(52) U.S. Cl.
CPC ....... *H01L 27/1244* (2013.01); *G09G 3/3233* (2013.01); *G09G 2300/0426* (2013.01)

(58) Field of Classification Search
None
See application file for complete search history.

(56) References Cited

U.S. PATENT DOCUMENTS

2001/0051385 A1  12/2001  Eguchi
2010/0163284 A1*  7/2010  Tanahara .......... G02F 1/133351
                                                            445/24
(Continued)

FOREIGN PATENT DOCUMENTS

CN          1797161 A     7/2006
CN        101127388 A     2/2008
(Continued)

OTHER PUBLICATIONS

PCT International Search Report for PCT/CN2019/118327, dated Mar. 4, 2020, 11 pages.

(Continued)

*Primary Examiner* — Amare Mengistu
*Assistant Examiner* — Sarvesh J Nadkarni
(74) *Attorney, Agent, or Firm* — Maier & Maier, PLLC

(57) ABSTRACT

The application discloses an array substrate and a mother-board for array substrates. The array substrate includes a display area and a non-display area on a periphery of the display area. The non-display area is provided with an interface area. The array substrate includes: multiple signal lines extending in the display area and leading to the non-display area; multiple pads located in the interface Area, and each of the multiple pads is connected to a corresponding one of the multiple signal lines; and a short-circuiting component located in the non-display area, wherein the short-circuiting component is connected with the multiple pads, the multiple signal lines connected with the pads are short-circuited, and the short-circuiting component includes a patterned first metal structure. The array substrate according to embodiments of the present application can avoid problems caused by static electricity, such as, electrostatic damage or product defects.

20 Claims, 4 Drawing Sheets

(56) References Cited

U.S. PATENT DOCUMENTS

2014/0184989 A1\* 7/2014 Park .................. G02F 1/136204
                                                                 445/24
2020/0333857 A1\* 10/2020 Liu ...................... G06F 1/1637

FOREIGN PATENT DOCUMENTS

| CN | 102566167 A | 7/2012 |
|----|-------------|--------|
| CN | 103676255 A | 3/2014 |
| CN | 103901641 A | 7/2014 |
| CN | 106940494 A | 7/2017 |
| CN | 107065363 A | 8/2017 |
| CN | 109445217 A | 3/2019 |
| CN | 109449140 A | 3/2019 |
| CN | 109801909 A | 5/2019 |
| CN | 110187575 A | 8/2019 |
| KR | 20080084221 A | 9/2008 |

OTHER PUBLICATIONS

The first office action and search report dated Feb. 21, 2020 for Chinese Application No. 201910452389.6, 9 pages.
The second office action dated May 25, 2020 for Chinese Application No. 201910452389.6, 8 pages.
The third office action dated Aug. 14, 2020 for Chinese Application No. 201910452389.6, 7 pages.
Notice of Allowance dated Nov. 18, 2020 in Chinese Patent Application No. 201910452389.6, 7 pages including English-language translation.

\* cited by examiner

ARRAY SUBSTRATE AND MOTHER-BOARD FOR ARRAY SUBSTRATES

CROSS REFERENCE TO RELATED APPLICATION

The application is a continuation of International Application No. PCT/CN2019/118327 filed on Nov. 14, 2019, which claims the benefit of priority to Chinese Patent Application No. 201910452389.6 filed on May 28, 2019 and entitled "ARRAY SUBSTRATE AND MOTHER-BOARD FOR ARRAY SUBSTRATES", both of which are incorporated herein by reference in their entireties.

TECHNICAL FIELD

The application relates to the field of display technology, and particularly to an array substrate and a mother-board for array substrates.

BACKGROUND

An array substrate is required to be prepared during a manufacturing process of a display panel. During multiple manufacturing procedures of the array substrate, there is usually static electricity generated on the array substrate. The static electricity may affect the subsequent manufacturing procedures of the array substrate, leading to a reduction of manufacturing yield of the array substrate and the display panel.

An existing approach for dealing with the static electricity generated on the array substrate is to disperse the static electricity on the array substrate with a short-circuiting component. However, the present short-circuit component uses a semiconductor structure. The semiconductor structure has a large impedance, resulting in that electrical charges accumulated on the array substrate cannot be quickly conducted and dispersed. As a result, there are still problems caused by the static electricity.

SUMMARY

The present application provides an array substrate and a mother-board for array substrates.

In an aspect, the present application provides an array substrate having a display area and a non-display area on a periphery of the display area, wherein the non-display area is provided with an interface area. The array substrate includes: a plurality of signal lines, extending in the display area and leading out to the non-display area; a plurality of pads located in the interface area, wherein each of the plurality of pads is connected with a corresponding one of the plurality of signal lines; and a short-circuiting component located in the non-display area, wherein the short-circuiting component is connected with the plurality of pads, the plurality of signal lines connected with the plurality of pads are short-circuited, and the short-circuiting component includes a patterned first metal structure.

According to the foregoing implementation of the aspect of the present application, the array substrate includes a plurality of pixel circuits arranged in the display area, each of the plurality of pixel circuits is connected with at least one of the plurality of signal lines, and the plurality of pixel circuits include a gate conductor, the gate conductor is made of a material same as that of the first metal structure.

According to any of the foregoing implementations of the aspect of the present application, the first metal structure and the gate conductor are arranged in a same layer.

According to any of the foregoing implementations of the aspect of the present application, each of the plurality of pads includes a first pad unit and a second pad unit arranged with an interval in a first direction, the first pad unit is connected with a corresponding one of the plurality of signal lines, the second pad unit is connected with the short-circuiting component, and the first pad unit and the second pad unit are both connected to an interconnection block of the short-circuiting component through via holes, the first pad unit and the second pad unit are electrically connected.

According to any of the foregoing implementations of the aspect of the present application, the array substrate includes a plurality of pixel circuits arranged in the display area, each of the plurality of pixel circuits is connected with at least one of the plurality of signal lines, and the plurality of pixel circuits include an active layer, the active layer is made of a material same as that of the interconnection block.

According to any of the foregoing implementations of the aspect of the present application, the interconnection block and the active layer are arranged in a same layer.

According to any of the foregoing implementations of the aspect of the present application, the short-circuiting component further includes a patterned semiconductor structure, and an orthographic projection of the semiconductor structure in a thickness direction of the array substrate is overlapped with an orthographic projection of the first metal structure in the thickness direction of the array substrate.

According to any of the foregoing implementations of the aspect of the present application, an insulating layer is arranged between the first metal structure and the semiconductor structure.

According to any of the foregoing implementations of the aspect of the present application, the array substrate includes a plurality of pixel circuits arranged in the display area, each of the plurality of pixel circuits is connected with at least one of the plurality of signal lines, and the plurality of pixel circuits include an active layer, the active layer is made of a material same as that of the semiconductor structure.

According to any of the foregoing implementations of the aspect of the present application, the semiconductor structure and the active layer are arranged in a same layer.

According to any of the foregoing implementations of the aspect of the present application, the short-circuiting component includes a short-circuiting bar; and a plurality of connection lines, wherein each of the plurality of pads is connected with the short-circuiting bar through a corresponding one of the plurality of connection lines.

According to any of the foregoing implementations of the aspect of the present application, the array substrate further includes: a protection layer covering the short-circuiting component.

According to any of the foregoing implementations of the aspect of the present application, a channel is provided on the protection layer, which penetrates from a surface of the protection layer to the first metal structure, and the channel is arranged to be intersected with the plurality of connection lines.

In another aspect, the present application provides a mother-board for array substrates, which includes a plurality of the array substrates of any of the above implementations, and the plurality of the array substrates are arranged in an array.

According to the foregoing implementation of the other aspect of the present application, the plurality of the array substrates are arranged into a plurality of rows, and each of the plurality of rows accommodates multiple array substrates of the plurality of the array substrates, and the mother-board for array substrates further includes a short-circuiting interconnection component including a first interconnection unit for connecting the multiple array substrates in a same row in series, and a second interconnection unit for connecting at least two rows of the plurality of rows of the array substrates in parallel.

According to any of the foregoing implementations of the other aspect of the present application, the short-circuiting interconnection component includes a patterned second metal structure, and the second metal structure is capable of connecting to the first metal structure through a via hole.

According to the array substrate of embodiments of the present application, the plurality of pads in the interface area may be short-circuited by the short-circuiting component, so that the plurality of signal lines connected to the plurality of pads are short-circuited. When electrostatic charges are generated in a certain part of the array substrate, the electrostatic charges may be dispersed across the entire array substrate through the short-circuiting component. The short-circuiting component may be connected to a stable voltage source, so that charges on the array substrate can be conducted and eliminated through the short-circuiting component. In the array substrate of the embodiments of the present application, the short-circuiting component includes the patterned first metal structure. Compared with a short-circuiting component of a semiconductor structure, the short-circuiting component including the patterned first metal structure is able to reduce greatly an impedance between the interconnected pads, so that charges can be dispersed more quickly after the generation of the static electricity, and problems caused by static electricity, such as, electrostatic damage or product defects, can be avoided.

In some alternative embodiments, the pads include a first pad unit and a second pad unit, which are arranged with an interval therebetween and are electrically connected to each other through the interconnection block, so that the short-circuiting component is still able to connect with the plurality of signal lines through the pads, so as to short-circuit the plurality of signal lines. Since the first pad unit and the second pad unit are spaced apart, and the second pad unit is connected to the short-circuiting component, when external moisture or the like corrodes the pads, the corroded part will be cut off by a gap between the first pad unit and the second pad unit, so as to avoid the external moisture to further corrode the first pad unit connected with the signal lines and thus improve corrosion resistance of the pads in the interface area of the array substrate.

According to the mother-board for array substrates of embodiments of the application, the short-circuiting component on each array substrate includes the patterned first metal structure. Compared with a short-circuiting component of a semiconductor structure, the short-circuiting component including the patterned first metal structure is able to reduce greatly an impedance between the connected pads, so that charges can be dispersed more quickly after the generation of the static electricity, and problems caused by static electricity, such as, electrostatic damage or product defects, can be avoided.

In some alternative embodiments, the mother-board for array substrates further includes a short-circuiting interconnection component, which connects short-circuiting components of at least a part of the array substrates on the mother-board for array substrates with each other. As a result, the dispersal of static electricity on a number of the array substrates on the mother-board for array substrates can be implemented, and thus the capability to disperse static electricity of the mother-board for array substrates can be further improved.

BRIEF DESCRIPTION OF THE DRAWINGS

By reading the following detailed description of non-limiting embodiments with reference to the accompanying drawings, other features, purposes and advantages of the present application will be more apparent, wherein the same or similar reference numerals indicate the same or similar features. The drawings are not drawn to real scale.

DETAILED DESCRIPTION

In order to make the objectives, technical solutions, and advantages of the application clearer, the application is described in further details below. It should be understood that the specific embodiments described herein are only configured to explain the application, and not to limit the application. For those skilled in the art, the application can be implemented without some of these specific details.

It is to be noted that relational terms such as first, second, and the like are used herein only to distinguish one entity or operation from another entity or operation, which are not necessarily to require or indicate that these entities or operations have any such relationship or order in fact.

It should be understood that when describing a structure of a component, when a layer or an area is referred to as being "on" or "above" another layer or another area, it may mean that the layer or area is directly on/above the other layer or area, or one or more other layers or areas may be included between the layer or area and the other layer or area. And, if the component is turned over, the layer or area will be "below" or "under" the other layer or area.

Embodiments of the application provide an array substrate, which may be an array substrate of an organic light-emitting diode (OLED) display panel, or an array substrate of a liquid crystal display (LCD), a micro light-emitting diode (Micro-LED), or other display panels. Herein, the term "array substrate" may refer to a finished array substrate that has undergone all manufacturing procedures in a process for manufacturing an array substrate, or an unfinished array substrate in any phase of the manufacturing procedures in the process for manufacturing an array substrate.

Figure 1:
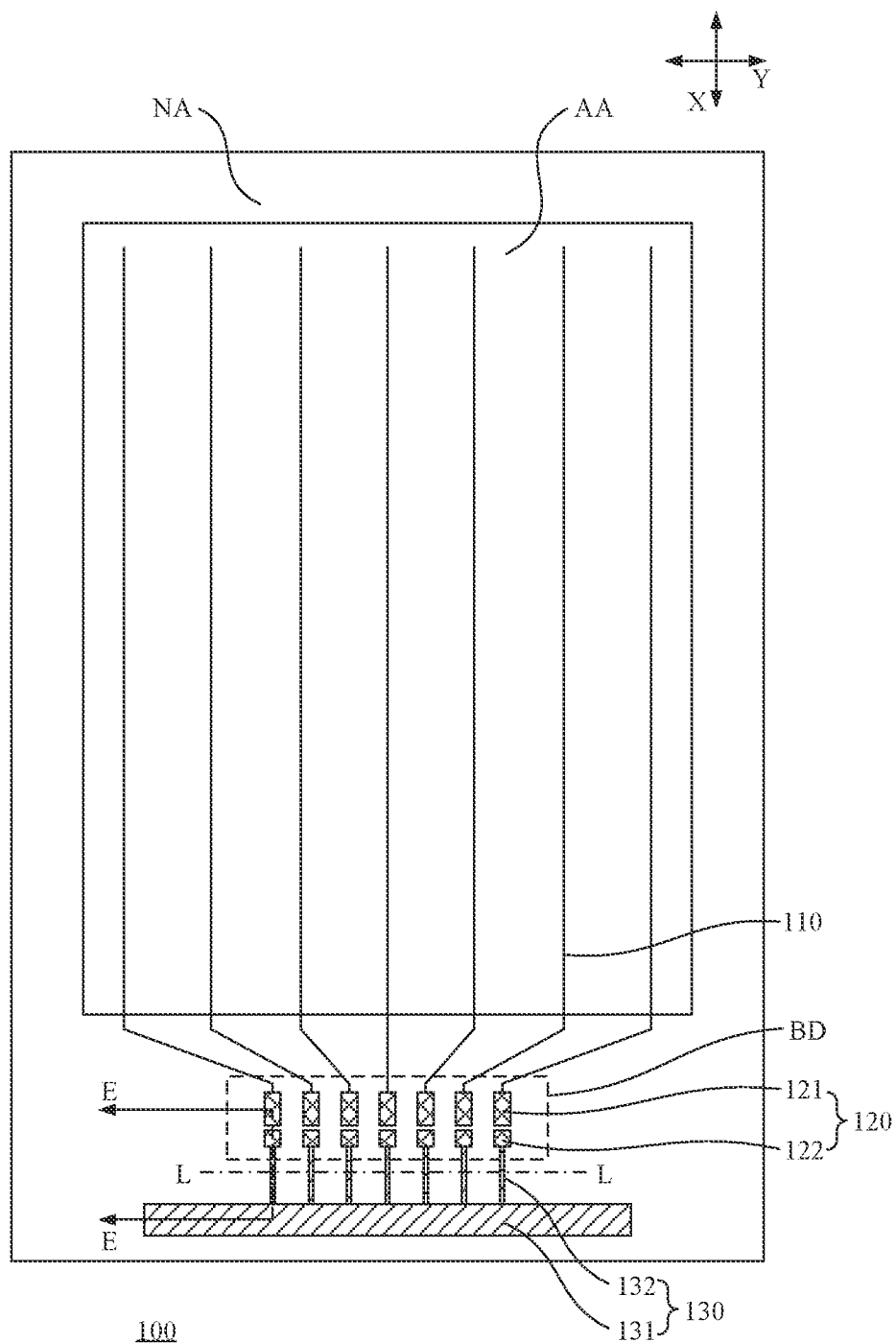
FIG. 1 is a schematic diagram of structure of an array substrate provided by an embodiment of the application.
Figure 2:
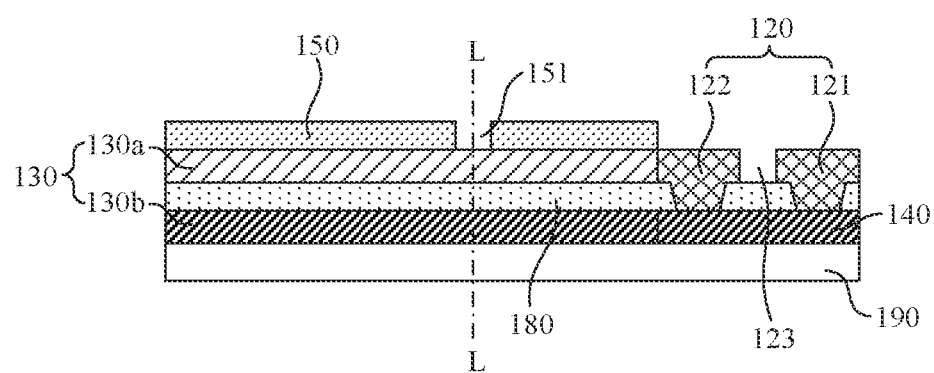
FIG. 2 is a schematic cross-sectional view along the E-E direction shown in FIG. 1.

FIG. 1 is a schematic diagram of structure of an array substrate provided by an embodiment of the application. FIG. 2 is a schematic cross-sectional view along the E-E direction shown in FIG. 1. An array substrate 100 of the embodiment of the application has a display area AA and a non-display area NA on a periphery of the display area AA. An interface area BD may be provided in the non-display area NA.

The array substrate 100 may include a plurality of signal lines 110, a plurality of pads 120, and a short-circuiting component 130. The plurality of signal lines 110 extend in the display area AA and lead out to the non-display area NA. In some embodiments, the array substrate 100 further includes a plurality of pixel circuits arranged in the display area AA. Each pixel circuit corresponds to one pixel of a display panel. For example, the pixel may be an OLED pixel. Each pixel circuit is used to drive the corresponding pixel to emit light. The plurality of pixel circuits are arranged in a predetermined pattern in the display area AA of the array substrate 100. Each pixel circuit may be connected to at least one of the plurality of signal lines 110.

The array substrate 100 may include a plurality of scan lines and a plurality of data lines. The plurality of scan lines may extend in the same direction and may be arranged with an interval between each other. The plurality of data lines may also extend in the same direction and may be arranged with an interval between each other. The extension direction of the scan lines and the extension direction of the data lines are crossed. Each pixel circuit may be connected to a scan line and a data line. The scan line may provide a switch signal to the pixel circuit, and the data line may provide a grayscale signal to the pixel circuit.

In some embodiments, the plurality of signal lines 110 may be the plurality of scan lines as mentioned above. In other embodiments, the plurality of signal lines 110 may be the plurality of data lines as mentioned above.

The interface area BD may be used to connect to an external circuit board. In some embodiments, the external circuit board is a flexible printed circuit (FPC), on which a driver chip and a control chip may be arranged.

The plurality of pads 120 are located in the interface area BD. Each of the plurality of pads 120 is connected to a corresponding one of the plurality of signal lines 110. In some embodiments, at least a part of the plurality of signal lines 110 are connected to the plurality of pads 120 respectively. The plurality of pads 120 may be electrically connected to the external circuit board, for example, electrically connected to a circuit on the FPC by a way of bonding. Correspondingly, the signal lines 110 may be electrically connected to the driver chip on the FPC.

The short-circuiting component 130 is located in the non-display area NA. The short-circuiting component 130 is connected to the plurality of pads 120, so that the plurality of signal lines 110 connected to the plurality of pads 120 are short-circuited. As shown in FIG. 2, in the embodiment, the short-circuiting component 130 includes a patterned first metal structure 130a.

According to the array substrate 100 of embodiment of the present application, the plurality of pads 120 in the interface area BD may be short-circuited by the short-circuiting component 130, so that the plurality of signal lines 110 connected to the plurality of pads 120 are short-circuited. When electrostatic charges are generated in a certain part of the array substrate 100, the electrostatic charges may be dispersed across the entire array substrate 100 through the short-circuiting component 130.

The short-circuiting component 130 may be connected to a stable voltage source, so that charges on the array substrate 100 can be conducted and eliminated through the short-circuiting component 130. In the array substrate 100 of the embodiment of the present application, the short-circuiting component 130 includes the patterned first metal structure 130a. Compared with a short-circuiting component of a semiconductor structure, the short-circuiting component 130 including the patterned first metal structure 130a is able to reduce greatly an impedance between the connected pads 120, so that charges can be dispersed more quickly after the generation of the static electricity, and problems caused by static electricity, such as, electrostatic damage or product defects, can be avoided.

In some embodiments, the pixel circuit may include transistor(s). According to different designs of the pixel circuit, a number of transistor(s) included in each pixel circuit may be adjusted according to its specific design. The pixel circuit may include an active layer for forming a source and a drain, and a gate conductor arranged above a channel of the active layer. The gate conductor is insulated from the active layer.

The gate conductor may be made of metal materials such as molybdenum (Mo) etc., by a way of patterning. In some embodiments, the first metal structure 130a is made of the same material as the gate conductor. In some embodiments, the first metal structure 130a and the gate conductor may be arranged in the same layer, so that the first metal structure 130a and the gate conductor may be formed at the same time during the same patterning process. As such, the short-circuiting component 130 with a lower impedance can be provided without increasing the manufacturing procedures of the array substrate, which improves an antistatic performance and saves a production cost at the same time.

As shown in FIG. 2, in some embodiments, the short-circuiting component 130 may further includes a patterned semiconductor structure 130b. An orthographic projection of the semiconductor structure 130b in a thickness direction of the array substrate 100 is overlapped with an orthographic projection of the first metal structure 130a in the thickness direction of the array substrate 100.

Particularly, as shown in FIG. 2, the array substrate 100 may include a substratum 190 in the non-display area NA of the array substrate 100. The substratum 190 may be glass, or a polymer substratum such as a polyimide (PI) film, or a substratum including polymer materials such as PI.

The semiconductor structure 130b may be located on the substrate 190. In some embodiments, a buffer layer may be provided between the semiconductor structure 130b and the substrate 190. The buffer layer may be an oxide layer or a nitride layer, for example, made of silicon nitride.

The first metal structure 130a may be located on the semiconductor structure 130b. In some embodiments, an insulating layer 180 may be provided between the first metal structure 130a and the semiconductor structure 130b. The insulating layer 180 may be an oxide layer or a nitride layer, for example, made of silicon nitride.

The orthographic projection of the semiconductor structure 130b in the thickness direction of the array substrate 100 may be overlapped with the orthographic projection of the first metal structure 130a in the thickness direction of the array substrate 100. That is, the short-circuiting component 130 includes, in its dimension of hierarchy, the semiconductor structure 130b and the first metal structure 130a which are arranged in stack, and the semiconductor structure 130b and the first metal structure 130a has the same structure in a plane dimension perpendicular to the thickness direction of the array substrate 100. By providing the short-circuiting component 130 of the stacked structure, on the one hand, the impedance of the short-circuiting component 130 can be further reduced to obtain the capability to disperse the static electricity more quickly, and on the other hand, the structural stability of the short-circuiting component 130 can be enhanced.

As mentioned above, in some embodiments, the pixel circuit may include the active layer, and the active layer may be made of semiconductor materials, such as, polycrystalline silicon (PSi), amorphous silicon (α-Si), low temperature poly-silicon (LTPS), and so forth. The patterned semiconductor structure 130*b* may be made of the same material as the active layer. The patterned semiconductor structure 130*b* and the active layer may be arranged in the same layer, so that they can be formed in the same patterning process and thus manufacturing procedures for processing may be saved.

In the above embodiments, the short-circuiting component 130 may include the first metal structure 130*a* and a semiconductor structure 130*b* which are arranged in stack. In some other embodiments, the short-circuiting component 130 may only include the first metal structure 130*a*.

As shown in FIG. 1, in some embodiments, the pads 120 include a first pad unit 121 and a second pad unit 122 arranged with an interval in a first direction X. The first pad unit 121 may be connected to a corresponding one of the plurality of signal lines 110, and the second pad unit 122 may be connected to the short-circuiting component 130. In some embodiments, the array substrate is rectangular, and the first direction X is, for example, a direction parallel to the length direction of the array substrate.

As shown in FIG. 2, a gap 123 is formed between the first pad unit 121 and the second pad unit 122. Each of the first pad unit 121 and the second pad unit 122 may be connected to an interconnection block 140 through a via hole, so that the first pad unit 121 and the second pad unit 122 are electrically connected.

In the above embodiments, the pads 120 includes the first pad unit 121 and the second pad unit 122 that are arranged with an interval therebetween and are electrically connected to each other through the interconnection block 140, so that the short-circuiting component 130 is still able to connect with the plurality of signal lines 110 through the pads 120, so as to short-circuit the plurality of signal lines 110. Since the first pad unit 121 and the second pad unit 122 are spaced apart, when external moisture or the like corrodes the pads 120, the corroded part will be cut off by the gap 123 between the first pad unit 121 and the second pad unit 122, so as to avoid the external moisture to further corrode the first pad unit 121 connected with the signal lines 110 and thus improve corrosion resistance of the pads 120 in the interface area BD of the array substrate 100.

In some embodiments, the interconnection block 140 may be made of the same material as the active layer of the pixel circuit. The interconnection block 140 and the active layer of the pixel circuit may be arranged in the same layer. In the embodiment, the interconnection block 140, the semiconductor structure 130*b* of the short-circuiting component 130, and the active layer of the pixel circuit are arranged in the same layer, so that they can be formed in the same patterning process and thus manufacturing procedures for processing may be saved.

In some other embodiments, the interconnection block 140 may also be made of other conductive materials. In some other embodiments, the interconnection block 140 may be arranged in the same layer as a certain metal layer of the array substrate 100 and thus they can be formed in the same patterning process.

As shown in FIG. 1, in the embodiment, the short-circuiting component 130 may include a short-circuiting bar 131 and a plurality of connection lines 132. The short-circuiting bar 131 may be a strip-shaped conductor structure extending in a predetermined direction. In this embodiment, the short-circuiting bar 131 extends in a second direction Y. Each of the pads 120 may be connected with the short-circuiting bar 131 through a corresponding connection line 132. Every two adjacent pads 120 are electrically connected by the connection lines 132 and short-circuiting bars 131 successively. In some embodiments, a resistance in the electrical connection structure between two adjacent pads 120 is less than 50 ohms.

In some embodiments, after a checkout of the array substrate 100, the connection lines 132 may be cut off by physical cutting or the like, so that the plurality of pads 120 are independent from each other and no longer short-circuited by the short-circuiting component 130. In FIG. 1 and FIG. 2, an extending direction of the dividing line for cutting off the plurality of connection lines 132 is shown by the L-L line. In some embodiments, the plurality of connection lines 132 all extend along the first direction X which is crossed with the second direction Y. The dividing line extends along the second direction Y and intersects with all the connection lines 132.

As shown in FIG. 2, in some embodiments, the array substrate 100 may further include a protection layer 150, which covers the short-circuiting component 130. In the embodiment, the protection layer 150 covers the first metal structure 130*a* of the short-circuiting component 130. A channel 151 may be provided on the protection layer 150. The channel 151 penetrates from the surface of the protection layer 150 to the first metal structure 130*a*, so that the first metal structure 130*a* is exposed at the channel 151. The location and extension direction of the channel 151 correspond to the location and extension direction of the aforementioned dividing line respectively, so that the channel 151 intersects with the plurality of connection lines 132. A dividing device divides the array substrate 100 along the channel 151, so as to implement the cut-off of the plurality of connection lines 132 as mentioned above.

Embodiments of the present application also provide a mother-board for array substrates. The mother-board for array substrates may include a plurality of array substrates arranged in an array. The array substrate may be the array substrate of any of the above embodiments. The array substrate 100 provided in the foregoing embodiments of the present application is taken as an example of the array substrate in the following description.

Figure 3:
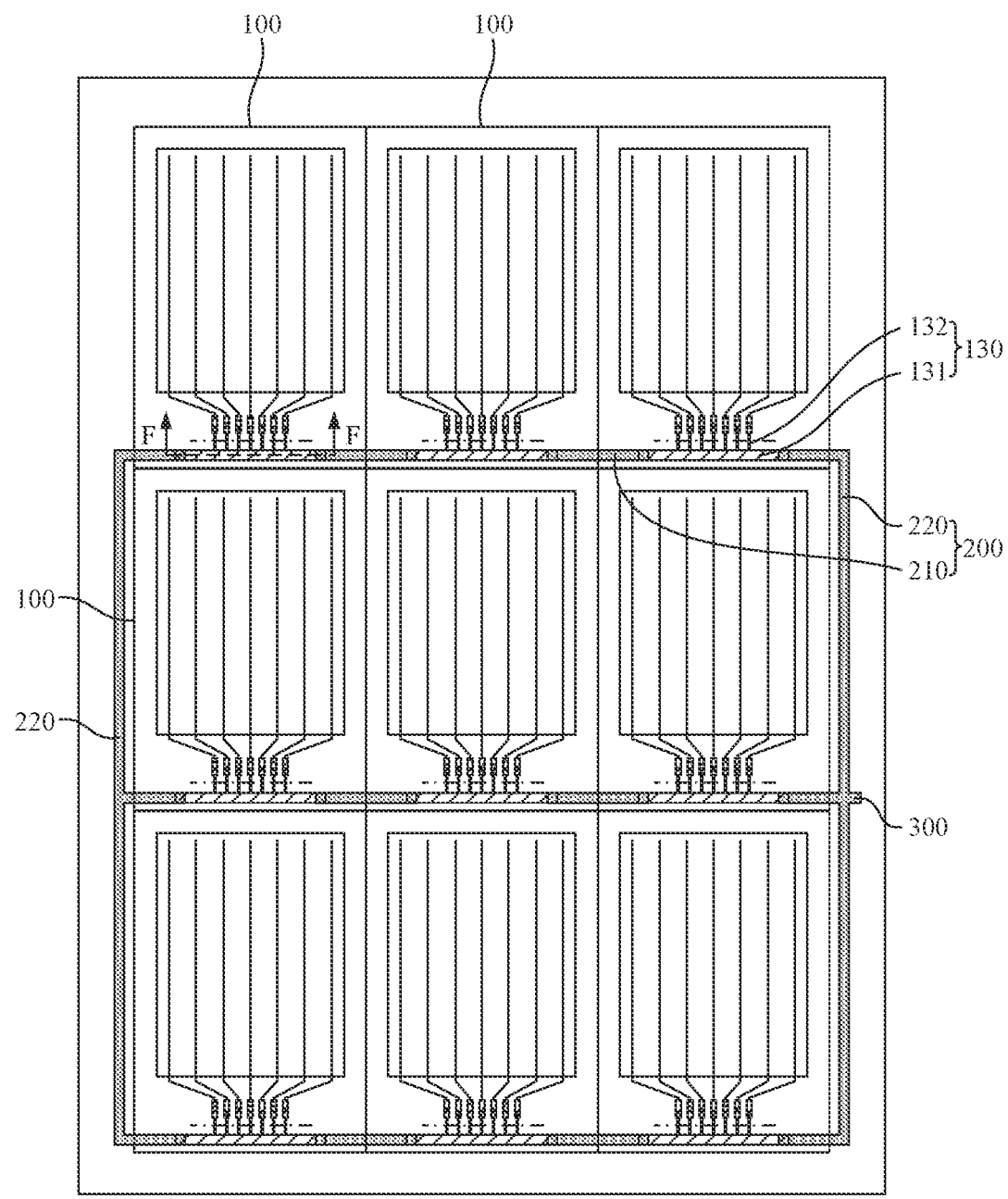
FIG. 3 is a schematic diagram of structure of a mother-board for array substrates provided by an embodiment of the application.
Figure 4:
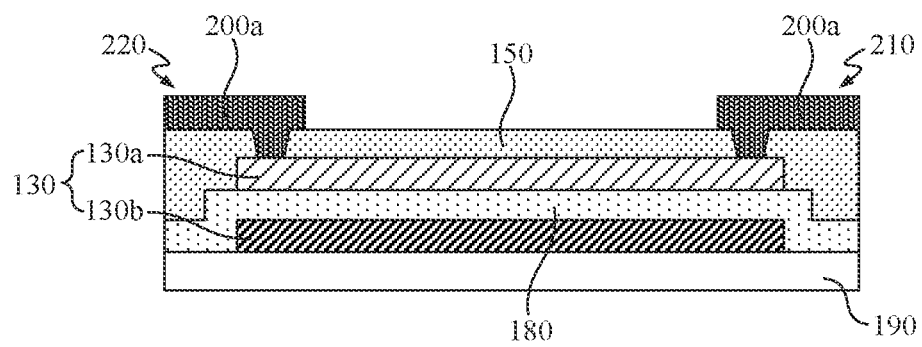
FIG. 4 is a schematic cross-sectional view along the F-F direction shown in FIG. 3.

FIG. 3 is a schematic diagram of structure of a mother-board for array substrates provided by an embodiment of the application. FIG. 4 is a schematic cross-sectional view along the F-F direction shown in FIG. 3.

In the mother-board for array substrates 1000, a plurality of array substrates 100 are arranged into a plurality of rows. Each of the plurality of rows accommodates multiple of the array substrates 100. The arrangement and the number of array substrates 100 in FIG. 3 are merely illustrative. In an arrangement formed by the plurality of array substrates 100, a number of the rows of the array substrates 100 and a number of the array substrates 100 in each row may be set according to actual needs.

According to the mother-board for array substrates 1000 of the embodiments of the application, the interface area BD of each array substrate 100 included in the mother-board for array substrates 1000 has the plurality of pads 120 which may be short-circuited through the short-circuiting component 130 so that the plurality signal lines 110 connected to the pads 120 are short-circuited. When electrostatic charges are generated in a certain part of the array substrate 100, the electrostatic charges may be dispersed across the entire array substrate 100 through the short-circuiting component 130.

In some embodiments, the short-circuiting component 130 may be connected to a stable voltage source, so that charges on the array substrate 100 can be conducted and eliminated through the short-circuiting component 130. In the array substrate 100 of the embodiments of the present application, the short-circuiting component 130 includes the patterned first metal structure 130a. Compared with a short-circuiting component of a semiconductor structure, the short-circuiting component 130 including the patterned first metal structure 130a is able to reduce greatly an impedance between the interconnected pads 120, so that charges can be dispersed more quickly after the generation of the static electricity, and problems caused by static electricity, such as, electrostatic damage or product defects, can be avoided.

In some embodiments, the mother-board for array substrates 1000 may further include a short-circuiting interconnection component 200. The short-circuiting interconnection component 200 can connect short-circuiting components 130 of at least a part of the array substrates 100 on the mother-board for array substrates 1000 with each other.

The short-circuiting interconnection component 200 may include a first interconnection unit 210 and a second interconnection unit 220. The first interconnection unit 210 may connect multiple array substrates 100 in the same row in series. The second interconnection unit 220 may connect at least two of the plurality of rows of the plurality of array substrates 100 in parallel.

In the embodiment shown in FIG. 3, a 3×3 array layout of a plurality of array substrates 100 is taken as an example for description. In the layout, the short-circuiting interconnection component 200 connects the short-circuiting components 130 of all the array substrates 100 on the mother-board for array substrates 1000 with each other. As a result, the dispersal of static electricity on all the array substrates 100 on the mother-board for array substrates 1000 can be implemented, and thus the capability to disperse static electricity of the mother-board for array substrates 1000 can be further improved.

In some other embodiments, the short-circuiting interconnection component 200 may connect the short-circuiting components 130 of a part of the array substrates 100 on the mother-board for array substrates 1000 to each other, and the static electricity on the multiple array substrates 100 connected to each other may be dispersed.

In some embodiments, a connection terminal 300 may be provided on the short-circuiting interconnection component 200. The short-circuiting interconnection component 200 may be connected to a stable voltage source through the connection terminal 300. As a result, charges on the plurality of array substrates 100 on the mother-board for array substrates 1000 may be conducted and eliminated through the short-circuiting components 130, the short-circuiting interconnection component 200, and the connection terminal 300.

As shown in FIG. 4, in some embodiments, the short-circuiting interconnection component 200 may include a patterned second metal structure 200a, which may be connected to the first metal structure 130a through a via hole. In FIG. 4, the right end of the first metal structure 130a forms a part of a structure of the first interconnection unit 210, and the left end of the first metal structure 130a forms a part of a structure of the second interconnection unit 220. In some embodiments, the second metal structure 200a and a certain metal layer of the array substrate 100 may be arranged in the same layer, and may be formed in the same patterning process to save manufacturing procedures for processing.

According to the above embodiments of the present application, these embodiments do not describe all the details exhaustively, nor do they limit the application to only the specific embodiments as described. Obviously, many modifications and changes can be made based on the above description. This specification selects and describes these embodiments in details, for the purpose of a better explanation of the principles and practical applications of the application. As a result, those skilled in the art can make good use of the application and make modifications on the basis of the application. The application is only limited by the claims and their full scope and equivalents.

What is claimed is:

1. An array substrate having a display area and a non-display area on a periphery of the display area, wherein the non-display area is provided with an interface area, and the array substrate comprises:
   a plurality of signal lines, extending in the display area and leading out to the non-display area;
   a plurality of pads located in the interface area, wherein each of the plurality of pads is connected with a corresponding one of the plurality of signal lines; and
   a short-circuiting component located in the non-display area, wherein the short-circuiting component is connected with the plurality of pads, the plurality of signal lines connected with the plurality of pads are short-circuited, the short-circuiting component includes a semiconductor structure and a first metal structure, and an orthographic projection of the semiconductor structure in a thickness direction of the array substrate coincides with an orthographic projection of the first metal structure in the thickness direction of the array substrate, and the semiconductor structure and the first metal structure have the same structure in a plane dimension perpendicular to the thickness direction of the array substrate.

2. The array substrate of claim 1, further comprising:
   a plurality of pixel circuits arranged in the display area, wherein each of the plurality of pixel circuits is connected with at least one of the plurality of signal lines, the plurality of pixel circuits comprise a gate conductor, and the gate conductor is made of a material same as that of the first metal structure.

3. The array substrate of claim 2, wherein the first metal structure and the gate conductor are arranged in a same layer.

4. The array substrate of claim 1, wherein each of the plurality of pads comprises a first pad unit and a second pad unit arranged with an interval in a first direction, the first pad unit is connected with a corresponding one of the plurality of signal lines, the second pad unit is connected with the short-circuiting component, the first pad unit and the second pad unit are both connected to an interconnection block of the short-circuiting component through via holes, and the first pad unit and the second pad unit are electrically connected.

5. The array substrate of claim 4, further comprising:
   a plurality of pixel circuits arranged in the display area, wherein each of the plurality of pixel circuits is connected with at least one of the plurality of signal lines, the plurality of pixel circuits comprise an active layer, and the active layer is made of a material same as that of the interconnection block.

6. The array substrate of claim 5, wherein the interconnection block and the active layer are arranged in a same layer.

7. The array substrate of claim 1, wherein an insulating layer is arranged between the first metal structure and the semiconductor structure.

8. The array substrate of claim 1, further comprising:
   a plurality of pixel circuits arranged in the display area, wherein each of the plurality of pixel circuits is connected with at least one of the plurality of signal lines, the plurality of pixel circuits comprise an active layer, and the active layer is made of a material same as that of the semiconductor structure.

9. The array substrate of claim 8, wherein the semiconductor structure and the active layer are arranged in a same layer.

10. The array substrate of claim 1, wherein the short-circuiting component further comprises:
a short-circuiting bar; and
a plurality of connection lines, wherein each of the plurality of pads is connected with the short-circuiting bar through a corresponding one of the plurality of connection lines;
and the short-circuiting component is connected to a stable voltage source.

11. The array substrate of claim 10, further comprising:
a protection layer covering the short-circuiting component.

12. The array substrate of claim 11, wherein a channel is provided on the protection layer, the channel penetrates from a surface of the protection layer to the first metal structure, and the channel is arranged to be intersected with the plurality of connection lines.

13. The array substrate of claim 1, further comprising:
a substrate located in the non-display area, wherein the semiconductor structure is located on the substrate and the first metal structure is located on the semiconductor structure.

14. A motherboard comprising a plurality of array substrates of arranged in an array, wherein each of the plurality of array substrates comprises a display area and a non-display area on a periphery of the display area, the non-display area is provided with an interface area, and the plurality of array substrates comprises:
a plurality of signal lines, extending in the display area and leading out to the non-display area;
a plurality of pads located in the interface area, wherein each of the plurality of pads is connected with a corresponding one of the plurality of signal lines; and
a short-circuiting component located in the non-display area, wherein the short-circuiting component is connected with the plurality of pads, the plurality of signal lines connected with the plurality of pads are short-circuited, the short-circuiting component includes a semiconductor structure and a first metal structure, and an orthographic projection of the semiconductor structure in a thickness direction of the array substrate coincides with an orthographic projection of the first metal structure in the thickness direction of the array substrate, and the semiconductor structure and the first metal structure have the same structure in a plane dimension perpendicular to the thickness direction of the array substrate.

15. The motherboard of claim 14, wherein the plurality of array substrates are arranged into a plurality of rows, and each of the plurality of rows accommodates multiple array substrates of the plurality of array substrates, and the motherboard further comprises:
a short-circuiting interconnection component comprising a first interconnection unit for connecting the multiple array substrates in a same row in series, and a second interconnection unit for connecting at least two rows of the plurality of rows of the plurality of array substrates in parallel.

16. The motherboard of claim 15, wherein the short-circuiting interconnection component further comprises:
a second metal structure configured to connect to the first metal structure through a via hole.

17. The motherboard of claim 14, wherein the plurality of array substrates comprises:
a plurality of pixel circuits arranged in the display area, wherein each of the plurality of pixel circuits is connected with at least one of the plurality of signal lines, the plurality of pixel circuits comprise a gate conductor, the gate conductor is made of a material same as that of the first metal structure, and the first metal structure and the gate conductor are arranged in a same layer.

18. The motherboard of claim 14, wherein each of the plurality of pads comprises a first pad unit and a second pad unit arranged with an interval in a first direction, the first pad unit is connected with a corresponding one of the plurality of signal lines, the second pad unit is connected with the short-circuiting component, and the first pad unit and the second pad unit are both connected to an interconnection block of the short-circuiting component through via holes, the first pad unit and the second pad unit are electrically connected; the plurality of array substrates comprises
a plurality of pixel circuits arranged in the display area, wherein each of the plurality of pixel circuits is connected with at least one of the plurality of signal lines, the plurality of pixel circuits comprise an active layer, the active layer is made of a material same as that of the interconnection block, and the interconnection block and the active layer are arranged in a same layer.

19. The motherboard of claim 14, wherein an insulating layer is arranged between the first metal structure and the semiconductor structure; and the plurality of array substrates comprises:
a plurality of pixel circuits arranged in the display area, each of the plurality of pixel circuits is connected with at least one of the plurality of signal lines, and the plurality of pixel circuits comprise an active layer, the active layer is made of a material same as that of the semiconductor structure, and the semiconductor structure and the active layer are arranged in a same layer.

20. The motherboard for array substrates of claim 14, wherein the short-circuiting component comprises:
a short-circuiting bar; and
a plurality of connection lines, wherein each of the plurality of pads is connected with the short-circuiting bar through a corresponding one of the plurality of connection lines, and the plurality of array substrates further comprises:
a protection layer covering the short-circuiting component; and a channel is provided on the protection layer, the channel penetrates from a surface of the protection layer to the first metal structure, and the channel is arranged to be intersected with the plurality of connection lines.

* * * * *